United States Patent
Yamagishi et al.

(10) Patent No.: US 7,690,881 B2
(45) Date of Patent: Apr. 6, 2010

(54) SUBSTRATE-PROCESSING APPARATUS WITH BUFFER MECHANISM AND SUBSTRATE-TRANSFERRING APPARATUS

(75) Inventors: Takayuki Yamagishi, Tama (JP); Tamihiro Kobayashi, Tama (JP); Akira Watanabe, Tama (JP); Kunihiro Kaneuchi, Tama (JP)

(73) Assignee: ASM Japan K.K., Tokyo (JP)

( * ) Notice: Subject to any disclaimer, the term of this patent is extended or adjusted under 35 U.S.C. 154(b) by 704 days.

(21) Appl. No.: 11/512,637

(22) Filed: Aug. 30, 2006

(65) Prior Publication Data

US 2008/0056854 A1 Mar. 6, 2008

(51) Int. Cl.
*B65G 49/07* (2006.01)

(52) U.S. Cl. .................. 414/744.2; 414/941; 294/2; 294/902

(58) Field of Classification Search .............. 414/744.2, 414/744.3, 941, 736
See application file for complete search history.

(56) References Cited

U.S. PATENT DOCUMENTS

| | | | | | |
|---|---|---|---|---|---|
| 4,775,281 | A | * | 10/1988 | Prentakis ............... | 414/416.03 |
| 5,564,889 | A | * | 10/1996 | Araki ..................... | 414/806 |
| 6,048,162 | A | * | 4/2000 | Moslehi .................. | 414/744.6 |
| 6,299,404 | B1 | * | 10/2001 | Muka et al. ............ | 414/744.5 |
| 6,485,248 | B1 | * | 11/2002 | Taylor, Jr. ............... | 414/672 |
| 6,585,478 | B1 | * | 7/2003 | Wood et al. ............ | 414/806 |
| 6,630,053 | B2 | | 10/2003 | Yamagishi et al. | |
| 6,722,834 | B1 | * | 4/2004 | Tepman .................. | 414/217 |
| 6,746,196 | B1 | * | 6/2004 | Ozawa et al. ........... | 414/217 |
| 6,748,293 | B1 | | 6/2004 | Larsen | |
| 6,852,007 | B1 | | 2/2005 | Gonzalez-Martin et al. | |
| 6,860,711 | B2 | | 3/2005 | Yamagishi | |
| 6,918,731 | B2 | | 7/2005 | Talmer | |
| 2002/0066330 | A1 | | 6/2002 | Namba et al. | |
| 2002/0102859 | A1 | | 8/2002 | Yoo | |
| 2003/0053904 | A1 | * | 3/2003 | Kirihata et al. ......... | 414/783 |
| 2004/0001750 | A1 | | 1/2004 | Kremerman | |

OTHER PUBLICATIONS

U.S. Appl. No. 11/445035, filed Jun. 1, 2006.

* cited by examiner

*Primary Examiner*—James Keenan
(74) *Attorney, Agent, or Firm*—Knobbe, Martens, Olson & Bear, LLP

(57) ABSTRACT

A substrate transfer apparatus for loading and unloading substrates in a reaction chamber, includes: an arm having a distal end which is laterally movable in a straight line direction; and end-effectors for loading and unloading substrates in a reaction chamber, which include a lower end-effector and an upper end-effector. One of the lower end-effector or the upper end-effector is movably coupled to the arm at a distal end of the arm, and the other end-effector is fixed to the movably coupled end-effector. The fixed end-effector is fixed to the movably coupled end-effector.

15 Claims, 8 Drawing Sheets

SUBSTRATE-PROCESSING APPARATUS WITH BUFFER MECHANISM AND SUBSTRATE-TRANSFERRING APPARATUS

BACKGROUND OF THE INVENTION

1. Field of the Invention

The present invention relates to a substrate-processing apparatus using a vacuum load-lock system and a substrate-transferring apparatus. The invention further relates to a buffer mechanism for buffering semiconductor substrates.

2. Description of the Related Art

Generally, chambers of a semiconductor-processing apparatus using a vacuum load-lock system, which is used for manufacturing conventional semiconductor integrated circuits, comprise a load-lock chamber, a transfer chamber and multiple reactors (process chambers) connected to the transfer chamber. For each chamber, a wafer transfer robot is used for supplying wafers automatically. The semiconductor-processing apparatus using a vacuum load-lock system operates in the following manner: First, an atmospheric robot carries a wafer from a cassette or a front opening unified pod ("FOUP", e.g., a box possessing detachable cassettes and a front opening interface) into a load-lock chamber. After evacuating air from the load-lock chamber, the wafer is transferred to each reactor by a vacuum robot provided inside a common polygonal transfer chamber. Wafers for which processing in the reactor is finished, are transferred into the load-lock chamber by the vacuum robot. Finally, after inside the load-lock chamber is restored to atmospheric pressure, processed wafers are transferred to the cassette or the FOUP by an atmospheric robot. Such apparatuses are generally called "cluster tools".

Conventionally, cluster tools have a single-wafer-processing type and a batch wafer-processing type. The single-wafer-processing type is a type in which a single wafer is processed by each reactor. The batch wafer-processing type is a type in which multiple wafers are processed by a single reactor.

With the batch wafer-processing type, productivity is high because multiple wafers are processed by a single reactor. In batch processing, the occurrence of non-uniformity of film thickness and film quality of a thin film formed on a wafer frequently becomes a problem. To improve uniformity of film thickness and film quality, using a single-wafer-processing type wafer processing apparatus is effective.

Problems that the invention can resolve are as follows:

In order to increase productivity using a conventional single-wafer-processing type processing apparatus, the number of reactors increases, a footprint (apparatus space required) and a faceprint (the panel width of a apparatus front) increase, and costs run up. This is because the apparatus has a common polygonal transfer room and reactors are attached to it radially. Additionally, due to the increase in the number of reactors, output significantly drops if operation discontinues due to apparatus breakdowns or maintenance.

Furthermore, in the thin film deposition process, it is often the case that process time is short and the processes are performed consecutively. For these reasons, if keeping the next wafer standing by inside a load-lock chamber, a wafer transferring mechanism needs to have double arms. If equipping the wafer transferring mechanism with the double arms, the transferring mechanism complexifies and costs run up. Additionally, the capacity of the load-lock chamber increases, hence time required for evacuating air and time required for restoring to atmospheric pressure are lengthened and transfer rate-limiting factors increase. As a result, throughput is restricted.

Furthermore, even in an apparatus using a regular polygonal type transfer chamber, for the purpose of carrying in and out wafers inside the reactor efficiently, although the wafer transferring mechanism having double arms is better, the transferring mechanism complexities and costs run up.

SUMMARY OF THE INVENTION

Accordingly, in an embodiment of the present invention, provided is a substrate-processing apparatus that realizes low costs, a small footprint and a small faceprint.

Further, in an embodiment of the present invention, provided is a substrate-processing apparatus that realizes stable processes and high throughput.

For example, according to an embodiment of the present invention, a substrate-processing apparatus provided with a vacuum load-lock system comprises: a load-lock chamber, a reaction chamber disposed in the vicinity of the load-lock chamber, and a transferring robot disposed outside the load-lock chamber, wherein the load-lock chamber includes a substrate-transferring arm comprised of a thin linked limb and multiple end-effectors connected to the limb for transferring substrates between the transferring robot and the reaction chamber.

In an embodiment, the load-lock chamber comprises two compartments disposed side by side and sharing a common environment, each compartment being provided with the substrate-transferring arm and connected to the reaction chamber via a gate valve (i.e., two reaction chambers are connected to one load-lock chamber having two compartments).

In an embodiment, the multiple end-effectors are dual end-effectors (each supporting one substrate) which are capable of transferring two substrates at a time and are capable of unloading an unprocessed substrate and loading a processed substrate in the reaction chamber without retracting from the reaction chamber. In the above, by a single movement of the transferring arm, two substrates can be transferred from the load-lock chamber to the reaction chamber and vice versa. For example, by a single extending and retracting movement of the single transferring arm, an unprocessed substrate can be buffered while a processed substrate can be withdrawn.

In an embodiment, the reaction chamber is provided with a buffer mechanism for buffering or temporarily supporting a processed substrate or an unprocessed substrate. The buffer mechanism of the reaction chamber cooperates with the transferring arm with the dual end-effectors. Even though a single arm is used for one reaction chamber, by using the single arm provided with multiple end-effectors and the buffer mechanism of the reaction chamber, transferring capacity can be greater than when dual arms are used, and the size of the load-lock chamber can be small. Further, throughput can significantly be high.

In an embodiment, the multiple end-effectors are not independently manipulative. For example, a fist end-effector is movably connected to a distal end of the arm, and a second end-effector is fixed to the first end-effector. Thus, operation of the transferring arm is not different from a transferring arm with a single end-effector.

In an embodiment, "buffering" means temporarily suspending or supporting a processed or unprocessed substrate in a reactor while another substrate is transferred into or out of the reactor. In an embodiment, "an end-effector" is a flange for supporting a substrate, which is movably connected to a limb.

For purposes of summarizing the invention and the advantages achieved over the prior art, certain objects and advantages of the invention have been described above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention.

Figure 1:
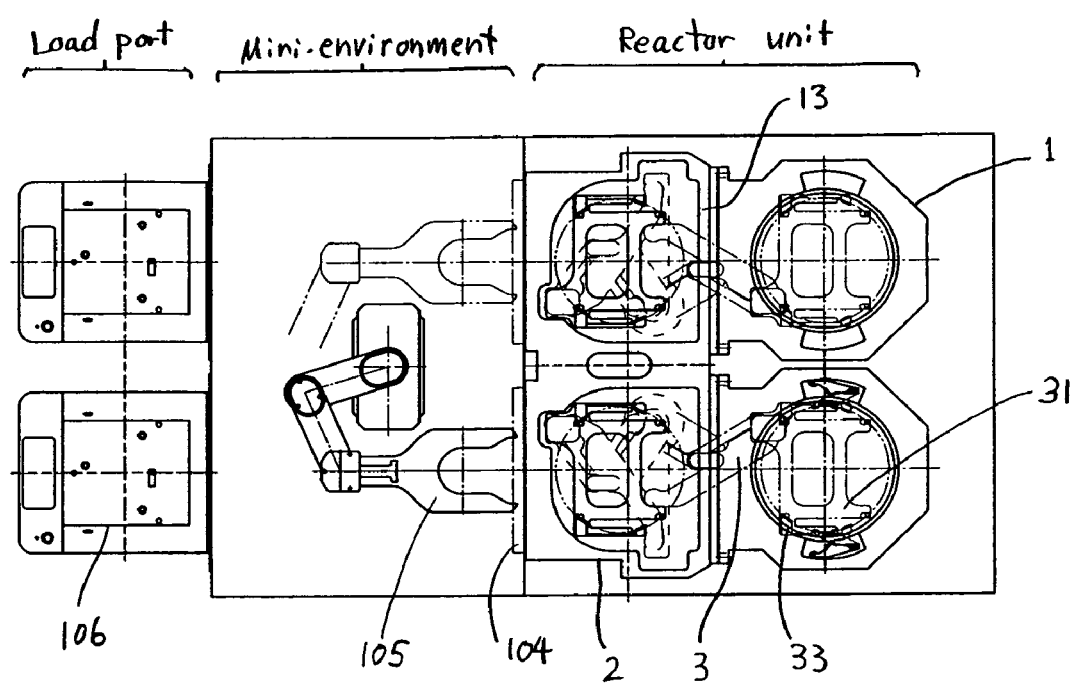
FIG. 1 is an explanatory plan view of the apparatus including a FOUP, a mini-environment, and a reactor unit according to an embodiment of the present invention.

The symbols used in the figures are as follows: 1: Reactor; 2: Load-lock chamber; 3: Transferring arm; 4: Supporting means; 5: Supporting means; 6: Cylinder; 7: Susceptor drive motor; 8: Up and down actuator; 9: Rotary actuator; 10: Bellows; 11: Rotary actuator; 12: Semiconductor wafer; 13: Gate valve; 14: Susceptor; 15: Wafer lift pin; 16: O-ring; 17: Main shaft; 20: Flapper valve; 21: Sensor dog; 2422: Photo electric sensor; 23: Slide shaft; 24: O-ring seal; 25: Portion to be attached to a bottom of the reactor; 31: Lower end-effector; 32: Supporting members; 33: Upper end-effector; 34: Steps; 35: Moving direction; 36: Retracting direction; 104: Gate valve; 105: Atmospheric robot; 106: FOUP or cassette.

DETAILED DESCRIPTION OF THE PREFERRED EMBODIMENT

The invention will be explained in detail below with reference to preferred embodiments. However, the preferred embodiments are not intended to limit the present invention.

1) A substrate transfer apparatus for loading and unloading substrates in a reaction chamber may comprise: (a) an arm having a distal end which is laterally movable in a straight line direction; and (b) end-effectors for loading and unloading substrates in a reaction chamber, which include a lower end-effector and an upper end-effector, wherein one of the lower end-effector or the upper end-effector is movably coupled to the arm at the distal end of the arm, and the other of the lower end-effector or the upper end-effector is fixed to the movably coupled end-effector, wherein the movably coupled end-effector has a front side, rear side, right side, and left side, and the fixed end-effector is comprised of multiple portions which are fixed to the movably coupled end-effector exclusively at the right and left sides.

The above embodiment further includes, but is not limited to, the following embodiments.

2) In 1), the movably coupled end-effector may be the lower end-effector, and the fixed end-effector is the upper end-effector.

3) In 1) or 2), the front and rear sides of the movably coupled end-effector may face a direction of lateral movement of the movably coupled end-effector.

4) In any one of 1) to 3), the arm may be configured to laterally and linearly move the end-effectors in a direction.

5) In any one of 1) to 4), the arm may comprise a proximal link and a distal link movably coupled to each other with a joint, and the end-effectors are movably coupled to the distal link with a joint.

6) In any one of 1) to 5), the apparatus may further comprise a load-lock chamber wherein the arm and the end-effectors are disposed when the arm and the end-effectors are at a retracted position.

7) In any one of 1) to 6) referring to 2), the upper end-effector may be comprised of two elongated portions which are disposed parallel to each other and fixed to the right and left sides of the lower end-effectors, respectively.

8) In 7), each elongated portion of the upper end-effector may have two substrate-contacting portions, and the lower end-effector has four substrate-contacting portions.

9) In another embodiment, a substrate processing apparatus may comprise: (A) a load-lock chamber; (B) at least one reaction chamber connected to the load-lock chamber via a gate valve; and (C) the substrate transfer apparatus of any one of 1) to 8) disposed in the load-lock chamber, wherein the arm and the end-effectors are extendable to the reaction chamber through the gate valve when opened for loading and unloading substrates in the reaction chamber.

The above embodiment further includes, but is not limited to, the following embodiments.

10) In 9), the apparatus may further comprise an atmospheric robot arm which is accessible to the load-lock chamber via a gate valve when opened for loading and unloading substrates in the load-lock chamber.

11) In 9) or 10), the reaction chamber may be provided with a buffer mechanism for keeping a substrate standing by inside the reaction chamber.

12) In still another embodiment, a method of transferring substrates between a reaction chamber and a load-lock chamber connected via a gate valve, may comprise: (i) loading an unprocessed substrate on an upper end-effector of a transferring arm in the load-lock chamber; (ii) lowering a susceptor on which a processed substrate is placed in the reaction chamber, thereby supporting the processed substrate on lift pins extending upward from the susceptor; (iii) upon opening the gate valve, laterally extending the transferring arm from the load-lock chamber to the reaction chamber, whereby the processed substrate supported on the lift pins is located between the upper end-effector and a lower end-effector of the transferring arm, where the unprocessed substrate is on the upper end-effector; (iv) supporting the unprocessed substrate using buffer arms provided in the reaction chamber, thereby loading the unprocessed substrate on the buffer arm; (v) raising the buffer arms with the unprocessed substrate while lowering the lift pins, thereby placing the processed substrate on the lower end-effector; (vi) retracting the transferring arm from the reaction chamber to the load-lock chamber and closing the gate valve; (vii) lowering the buffer arms with the unprocessed substrate, thereby supporting the unprocessed substrate on the lift pins extending upward from the susceptor; (viii) raising the susceptor, thereby loading the unprocessed substrate on the susceptor; and (ix) unloading the processed substrate from the lower end-effector and performing step (i) in the load-lock chamber while processing the unprocessed substrate in the reaction chamber, followed by steps (ii) to (ix).

The above embodiment further includes, but is not limited to, the following embodiments.

13) In 12), the transferring arm may be selected from any one of the transferring arms of 1) to 8).

14) In yet another embodiment, a method of transferring substrates between a first chamber and a second chamber, may comprise: (i) loading a first substrate on an upper end-effector of a transferring arm in the first chamber; (ii) laterally extending the transferring arm from the first chamber to the second chamber, whereby a second substrate in the second chamber is located between the upper end-effector and a lower end-effector of the transferring arm, where the first substrate is on the upper end-effector; (iii) unloading the first substrate from the upper end-effector and loading the second substrate on the lower end-effector; (iv) retracting the transferring arm from the second chamber to the first chamber; and (v) unloading the second substrate from the lower end-effector and performing step (i) in the first chamber, followed by steps (ii) to (v).

15) In 14), the transferring arm may be selected from any one of the transferring arms of 1) to 8).

16) In 13) or 14), the first chamber may be a load-lock chamber, the second chamber may be a reaction chamber, the fist substrate is an unprocessed substrate, and the second substrate is a processed substrate.

17) In a further embodiment, a substrate processing apparatus may comprise: (a) a load-lock chamber; (b) at least one reaction chamber connected to the load-lock chamber via a gate valve; and (c) a means for transferring substrates between the load-lock chamber and the reaction chamber and keeping an unprocessed substrate and a processed substrate stand-by in the reaction chamber without retracting from the reaction chamber.

In the above, the substrate may be any type of substrate including, but not limited to, a semiconductor wafer.

The present invention will be further explained below with reference to drawings. However, the drawings show embodiments and are not intended to limit the present invention.

FIG. 1 is an explanatory top view showing a wafer-processing apparatus for forming a thin film on a semiconductor wafer according to an embodiment of the present invention. The apparatus comprises a FOUP 106, a mini-environment in which an atmospheric robot 105 is disposed, a load-lock chamber 2, and a reaction chamber 1 connected to the load-lock chamber 2 via a gate valve 13. The load-lock chamber 2 is composed of two compartments, each being provided with a transferring arm 3 with dual end-effectors 31, 33 (see FIGS. 4 and 5). The load-lock chamber 2 and the two reaction chambers 1 constitute a module or reactor unit. The processing apparatus is not limited to the above configurations but can have any suitable configurations such as those disclosed in U.S. Pat. No. 6,630,053, the disclosure of which is incorporated herein in its entirety.

Figure 3A:
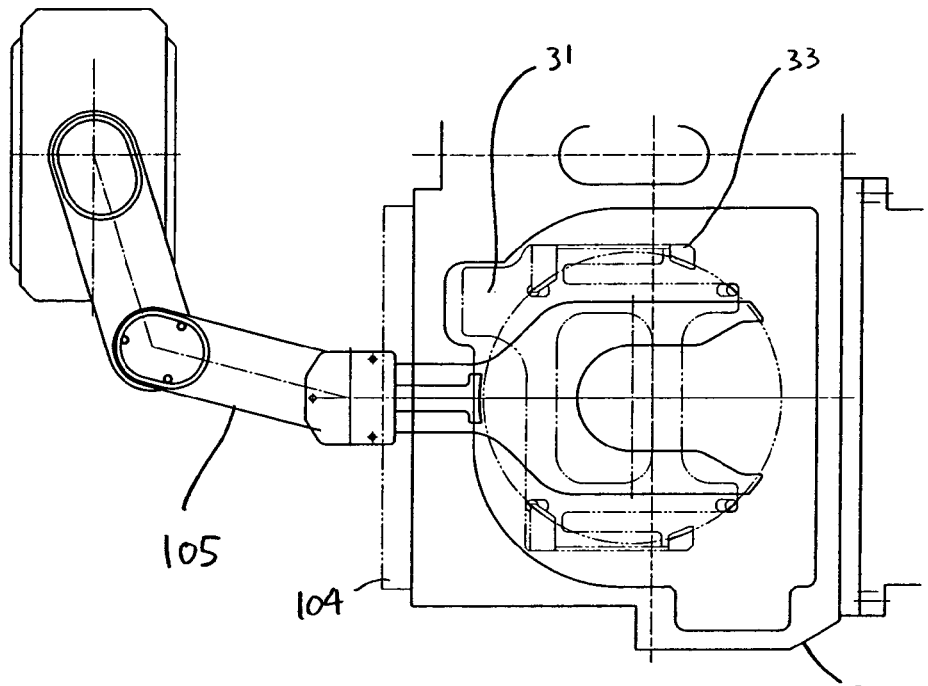
FIG. 3(a) is an explanatory plan view of the load lock chamber and the atmospheric robot shown in FIG. 1.
Figure 3B:
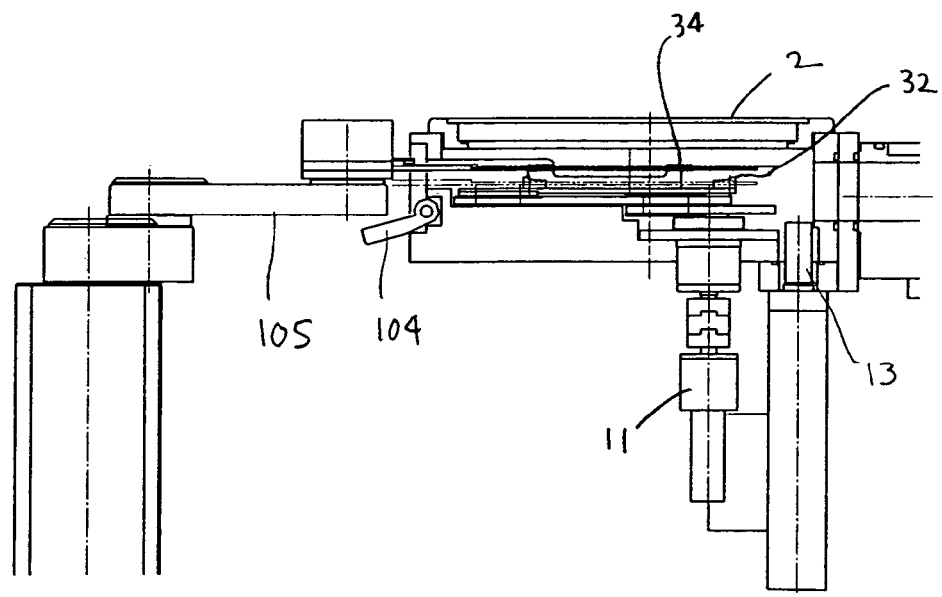
FIG. 3(b) is an explanatory side view of the load lock chamber and the atmospheric robot shown in FIG. 1.

The atmospheric robot 105 can move laterally side to side and back and forth to transfer substrates between the FOUP 106 and the load-lock chamber 2. Further, the atmospheric robot 105 can move vertically so that it can be positioned at an upper end-effector 33 and at a lower end-effector 31. That is, the atmospheric robot 105 can unload a substrate (e.g., a processed substrate) from the lower end-effector 31 in the load-lock chamber 2 and carries it to the FOUP 106, and also the atmospheric robot 105 carries a substrate (e.g., an unprocessed substrate) from the FOUP 106 and loads it to the upper end-effector 33. FIG. 3(a) is an explanatory plan view of the load lock chamber 2 and the atmospheric robot 105, and FIG. 3(b) is an explanatory side view of the load lock chamber 2 and the atmospheric robot 105. The atmospheric robot 105 can transfer substrates between the load lock chamber 2 and the mini-environment via the gate valve 104. In an operation sequence according to an embodiment of the present invention, the atmospheric robot 105 unloads a processed substrate placed on the lower end-effector 31 (i.e., on the supporting members 32 of the lower end-effector 31) and moves it to the FOUP, and then the atmospheric robot 105 takes an unprocessed substrate from the FOUP and loads it to the upper end-effector 33 (i.e., on the steps 34 of the upper end-effector 33). The above order can be revered. During the above operation, the end-effectors and the arm do not move and stay in the load lock chamber 2. In the alternative, the atmospheric robot 105 does not move vertically, but the end-effectors and the arm can move vertically so that the atmospheric robot 105 can load and unload substrates to and from the end-effectors.

Figure 2A:
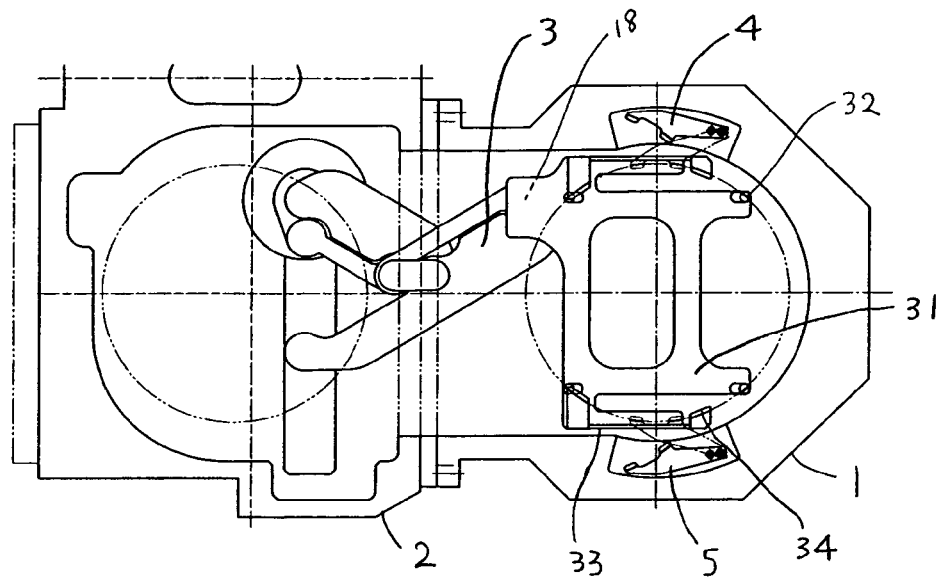
FIG. 2(a) is an explanatory plan view of the reactor unit shown in FIG. 1.
Figure 2B:
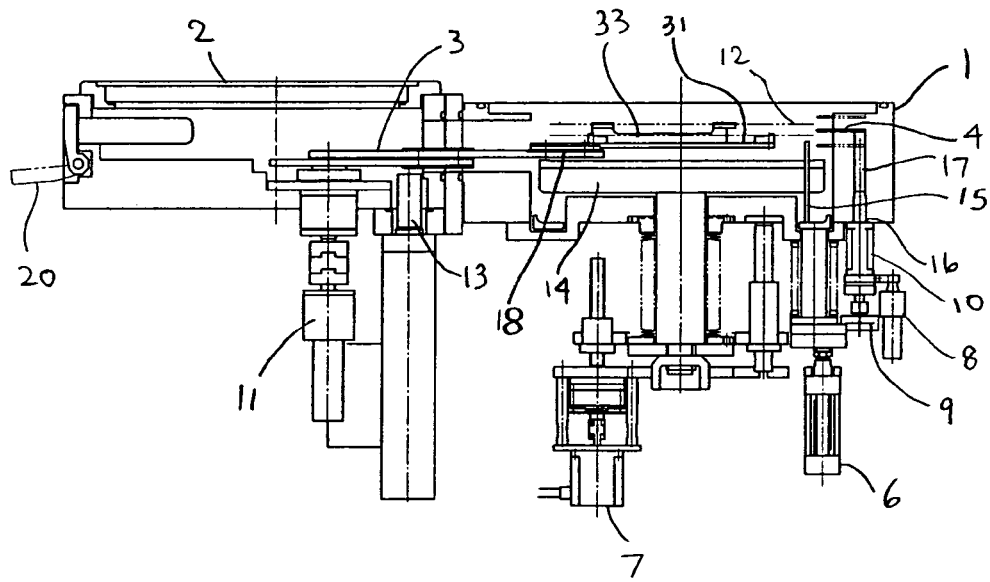
FIG. 2(b) is a modified side view of the reactor unit, which is modified in such a way that the wafer lift pins and the buffering mechanism can be shown, according to an embodiment of the present invention.

FIG. 2(a) is an explanatory plan view of the reactor unit shown in FIG. 1, and FIG. 2(b) is a modified cross sectional view of the module comprised of the load-lock chamber and the reaction chamber according to an embodiment of the present invention. There are provided the reactor 1 for growing a film on a semiconductor wafer 12, the load-lock chamber 2 for keeping a semiconductor wafer 12 standing by in vacuum, wherein the load-lock chamber 2 is directly connected to the reactor 1 through a gate valve 13, and a wafer-transferring arm 3 provided inside the load-lock chamber 2, which wafer-transferring arm has one thin link-type arm shaft for transferring the semiconductor wafer 12 into the reactor 1.

In the reactor 1, a susceptor 14, on which the semiconductor wafer 12 is placed, and a shower plate (not shown) for uniformly introducing a jet of reaction gas to the semiconductor wafer 12 are provided. In a plasma enhanced CVD (PECVD), the susceptor 14 and the shower plate together comprise high-frequency power electrodes. By reducing a distance between the susceptor 14 and the shower plate, a plasma reaction area can be reduced. The reaction chamber or rector need not be a PECVD chamber but can be any suitable chamber for any type of reaction including CVD, PVD, and ALD (atomic layer deposition).

Near the circumference of the susceptor 14, at least three wafer lift pins 15 attached at even intervals pass right through the susceptor vertically. The wafer lift pins 15 can move up and down by a cylinder 6.

Near the periphery of the susceptor 14, at least one pair of a buffer mechanism is provided. The buffer mechanism concerned has at least 2 (e.g., 2, 3, or 4) supporting means (4, 5) for supporting the semiconductor wafer 12 (which is placed on the upper end-effector 34), which are provided around the susceptor 14 and which rotate in a horizontal direction. Rotations of the supporting means are synchronized, and only when buffering the semiconductor wafer, the supporting means rotate toward the inside of the susceptor 14 to support the wafer. The supporting means (4, 5) comprise preferably a thin plate material of 2 mm to 5 mm in width. The shape of the supporting means (4, 5) is not limited as long as the shape can support the wafer 12 stably. If the contact area of the supporting means with the wafer is large, it causes contamination. For this reason, it is preferable that the shape of a portion of the supporting means (4, 5), which contacts the back side of the wafer, is a shape curving along the circumference so that the portion line-contacts the back side of the wafer. Additionally, as a material used for the supporting means (4, 5), to avoid contamination, ceramics or aluminum is preferable. Each of the supporting means (4, 5) is coupled to the upper end of a shaft means 17 and is supported vertically. The lower end of the shaft means 17 is coupled to an up and down actuator 8 and a rotary actuator 9, and the supporting means is rotated by the rotary actuator. The shaft means 17, the up and down actuator 8, and the rotary actuator 9 are isolated from the outside by bellows 10. Furthermore, the shaft means 17 is sealed preferably by an O-ring 16. The rotary actuator 9 can be operated electrically or by air pressure. To the lower end of the shaft means 17, the up and down actuator 8 is dynamically connected. The up and down actuator 8 can move the shaft means 17 up and down, and by this, the supporting means (4, 5) move up and down as well. The up and down actuator 8 can be operated electrically or by air pressure. The diameter of the shaft means 17 is preferably within the range of 8 mm to 16 mm. As a material used for the shaft means 17, to avoid contamination, ceramics or aluminum is preferable.

Figure 6A:
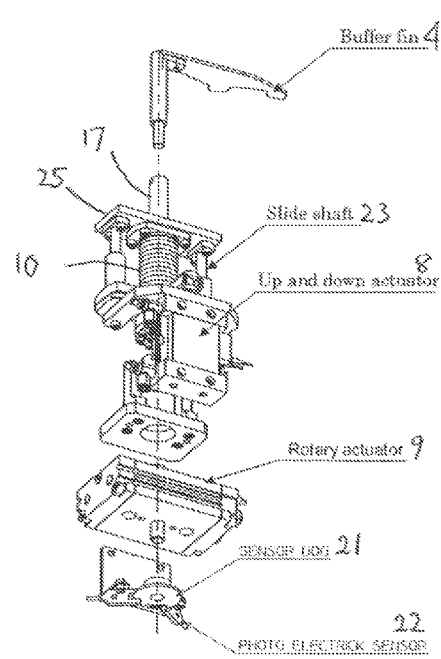
FIG. 6(a) is a broken up perspective view from a bottom end of the buffer mechanism according to an embodiment of the present invention.
Figure 6B:
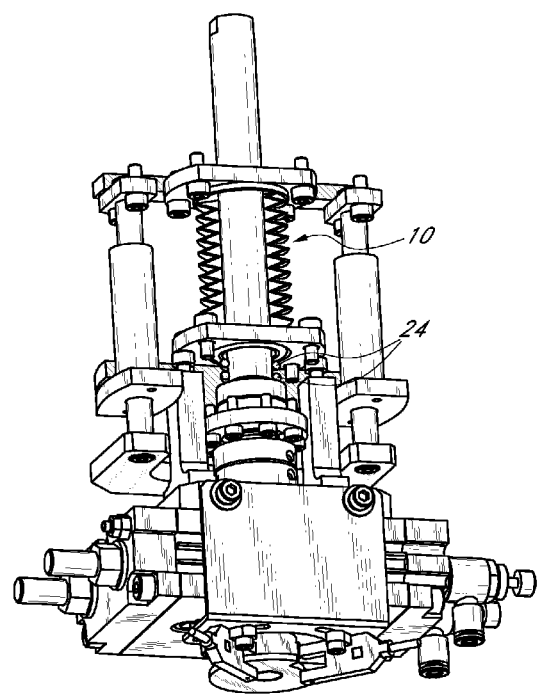
FIG. 6(b) is a partially cross-sectional perspective view of an actuation portion according to an embodiment of the present invention.

FIGS. 6(*a*) and 6(*b*) show the buffer mechanism according to an embodiment of the present invention. FIG. 6(*a*) is a broken up perspective view from a bottom end of the buffer mechanism. FIG. 6(*b*) is a partially cross-sectional perspective view of an actuation portion. The supporting means is a buffer fin 4. A portion 25 is fixed to a bottom of the reactor. The buffer fin is attached to a main shaft 17 which moves up and down using the up and down actuator 8 with slide shafts 23 which are disposed on both sides of the main shaft. The main shaft 17 is enclosed in the bellows 10 and sealed with an O-ring 24, so that even though the main shaft 17 rotates and ascends/descends inside the reactor, the interior of the reactor is sealed from the outside. The main shaft 17 rotates using the rotary actuator 9. The height of the buffer fin 4 is controlled using a sensor dog 21 and a photo electric sensor 22. In an embodiment, the buffer fin 4 can have three heights: high (buffer position), intermediate (unloading/loading position), and low (bottom position).

A point to notice here is that although the semiconductor-processing apparatus shown in FIG. 1 comprises one load-lock chamber (with two compartments) and two reactors that are directly connected to the load-lock chamber, the present invention is not limited to this embodiment. For example, a load-lock chamber with a single compartment and a single reactor can be connected. However, by arranging two units shown in FIG. 1 in parallel and making a load-lock chamber commonly used, and by using an independent transfer system, two wafers can be concurrently transferred to the reactors and wafers can be processed concurrently in two reactors. Additionally, the buffer mechanism in an embodiment can be applied to all semiconductor-processing apparatuses having any suitable single-wafer-processing type reactor. For example, the buffer mechanism also can be applied to any suitable single-wafer-processing type semiconductor-processing apparatus (e.g., Eagle 10™ manufactured by Japan ASM) in which a load-lock chamber and a reactor are connected through a transfer chamber.

An operation sequence in the case where the buffer mechanism of the semiconductor-processing apparatus shown in FIG. 2(*b*) is not used, is described. First, an atmospheric robot carries a semiconductor wafer 12 from a cassette or a FOUP into respective load-lock chambers 2 through a flapper valve 20. After carrying-in of the wafer is finished, the flapper valve 20 is closed, and air is evacuated from the load-lock chamber 2 by a dry pump (not shown). A gate valve 13 is opened, a wafer transferring arm 3 having a thin-link type arm extends by a rotary actuator 11, and the semiconductor wafer 12 is transferred onto a susceptor 14 inside the reactor 1. Because the wafer transferring arm 3 comprising a link-type arm is movably connected to the end-effector 31 at a distal end 18, the end-effectors can reciprocate between the load-lock chamber 2 and the reactor 1 in a straight-line direction. This configuration requires only mechanical positioning adjustment. The substrate lift pins 15 protrude from the surface of the susceptor 14 to support the semiconductor wafer 12. The wafer transferring arm 3 is placed inside the load-lock chamber 2, and the gate valve 13 is closed. The susceptor 14 goes up by a susceptor drive motor 7, and the semiconductor wafer 12 is placed on the surface of the susceptor 14. After that, thin-film deposition processing onto the semiconductor wafer 12 begins. After the thin-film deposition processing is finished, the processed semiconductor wafer is transferred to the cassette or the FOUP by tracking back the order of the operation sequence inversely this time. The arm 3 can be of any type which has a proximal end configured to be connected to an actuator, and which can laterally move with multiple axes of lateral movement. The arm 3 preferably has three degrees of lateral movement, so that the distal end 18 of the arm 3 (which is movably connected to the end-effectors) can move in a straight line direction (e.g., between the load lock chamber 2 and the reaction chamber 1).

As described, in the semiconductor-processing apparatus not having a buffer mechanism, because only one transferring arm per reactor exists, there was a problem that throughput is limited by a transfer rate-determining factor. The buffer mechanism in the reactor can solve this problem as descried in U.S. Pat. No. 6,860,711, the disclosure of which is incorporated herein in its entirety. In an embodiment of the present invention, the throughput can significantly improve as compared with that in U.S. Pat. No. 6,860,711, by combination with the transferring arm with multiple end-effectors.

Figure 4:
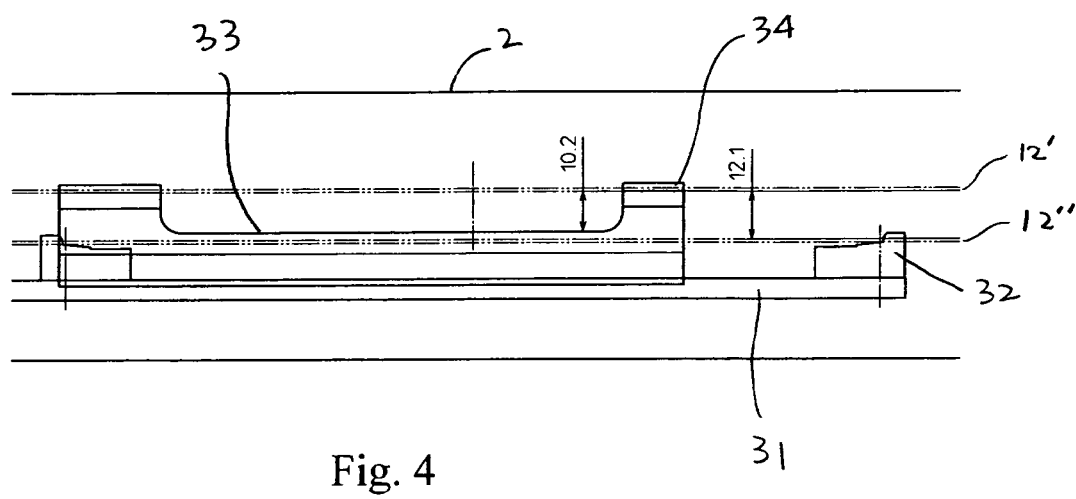
FIG. 4 is an explanatory side view of the end-effectors according to an embodiment of the present invention.
Figure 5:
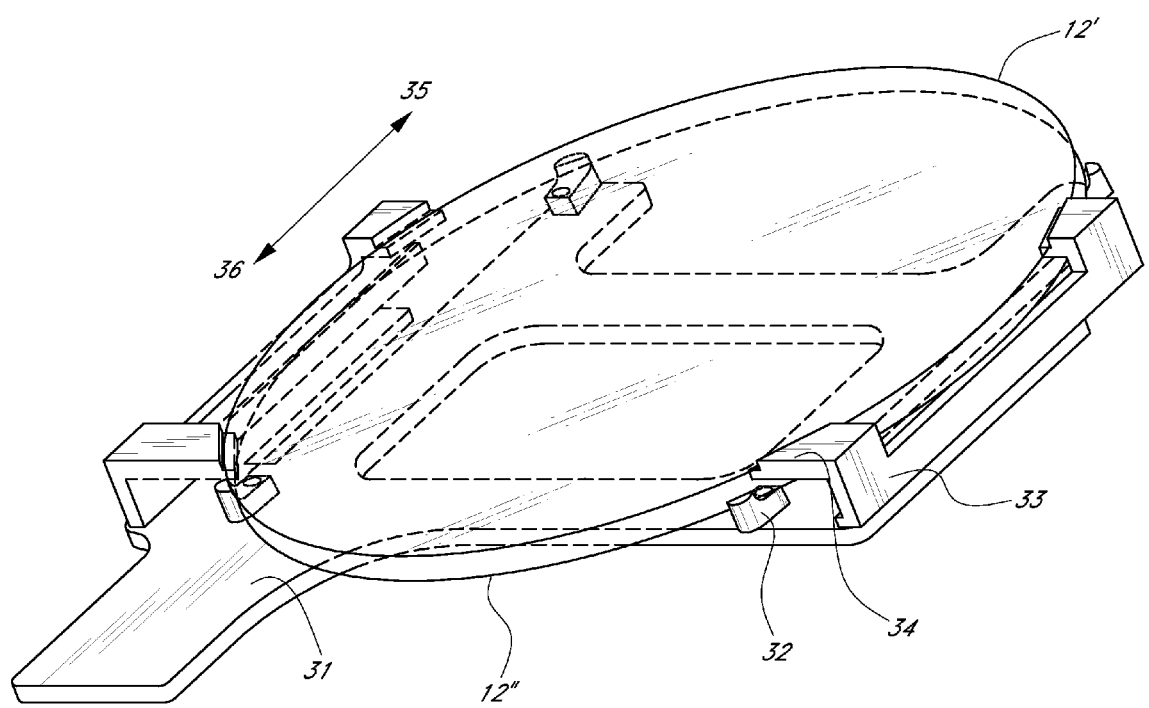
FIG. 5 is a schematic perspective view of the end-effectors according to an embodiment of the present invention.

FIG. 4 is an explanatory side view of the end-effectors according to an embodiment of the present invention (the lower end-effector 31 is drawn to be transparent where the upper end-effector 33 and the lower end-effector 31 overlap). FIG. 5 is a schematic perspective view of the end-effectors according to an embodiment of the present invention. The end-effectors are composed of a lower end-effector 31 and an upper end-effector 33, and the a proximal end of the lower end-effector 31 is movably connected to a transferring arm such as that shown in FIG. 1 wherein three axes of lateral movement are provided. The end-effectors move in a direction indicated by arrows 35, 36 in FIG. 5. The direction 35 is a direction toward the reactor, and the direction 36 is a direction toward the load-lock chamber. In FIG. 5, substrates 12' and 12" are shown as transparent plates for illustrative purposes. On the lower end-effector 31, there are provided four supporting members 32 for supporting the periphery of the processed substrate 12". The upper end-effector 33 is composed of two side members disposed at right and left sides of the lower end-effector 31 so that the upper end-effector does not interfere with loading and unloading substrates using the buffer fin and the atmospheric robot. Each side member of the upper end-effector 33 has steps 34 corresponding to the periphery of the unprocessed substrate 12'.

The height of the steps may be about 2 mm (±50%), and the height of the supporting members 32 may be 2.3 mm (±50%) in an embodiment. The distance between the upper end-effector 33 and the lower end-effector 31 (defined as a distance between the upper and lower substrates) may be 13 mm (±50%) in an embodiment (in FIG. 4, the distance is 12.1 mm). The distance can be adjusted depending on the other configurations of the apparatus including the buffer fins and the atmospheric robot. The elongated side members 33 of the upper end-effector have a shape such that the buffer fins can approach laterally the periphery of the substrate and pick up and buffer the substrate. In an embodiment, the clearance for supporting a substrate by the buffer fins may be 10 mm (±50%) (in FIG. 4, the clearance is 10.2 mm). Further, the two elongated members 33 of the upper end-effector are disposed at the right and left sides of the lower end-effector 31 with respect to the moving direction, and the two elongated members 33 are so separated that a substrate can be inserted between the upper and lower end-effectors and can be loaded on the lower end-effector 31. In an embodiment, the distance between the two elongated members 33 is slightly greater than the outer diameter of the substrate (however, the end-effectors must be smaller than the width of the gate valve in order to pass through the gate valve). The lower end-effector 31 has a configuration such that the end-effector 31 does not interfere with movement of the lift pins. In the above, a processed substrate is loaded on the lower end-effector 31 using the lift pins, whereas an unprocessed substrate is unloaded from the upper end-effector 33 using the buffer fins. The end-effectors are designed to achieve at least the above functions, depending on the entire configurations.

The upper end-effector may be made of aluminum ceramics or surface anodized aluminum in an embodiment. The lower end-effector may be made of aluminum ceramics in an embodiment. The supporting members may be made of Serazol™ (polybenzimidazole resin), polyimide resin, or Peek™ polymer, surface anodized aluminum, etc. in an embodiment.

In FIGS. 4 and 5, the lower end-effector 31 is movably connected to the arm. However, in another embodiment, an upper end-effector is movably connected to the arm, and a lower end-effector is fixed to the upper end-effector. For example, the lower end-effector has an L-shape cross section as with the upper end-effector in FIGS. 4 and 5, but steps are formed on an inner protrusion for supporting the periphery of a substrate. Further, supporting members are disposed on an upper surface of the upper end-effector.

In FIGS. 4 and 5, the two elongated members of the upper end-effector 33 are disposed at the right and left sides of the lower end-effector 31, respectively. However, in another embodiment, three, four or more separate members can be disposed at or in the vicinity of the outer periphery of the lower end-effector.

Figure 7:
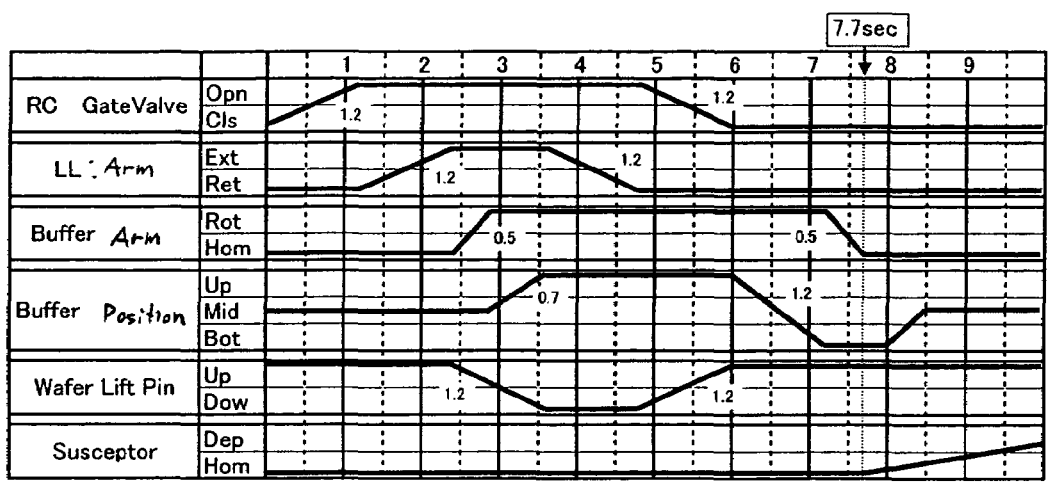
FIG. 7 shows an operation sequence when buffering an unprocessed wafer and a processed wafer in an embodiment of the present invention.
Figure 8:
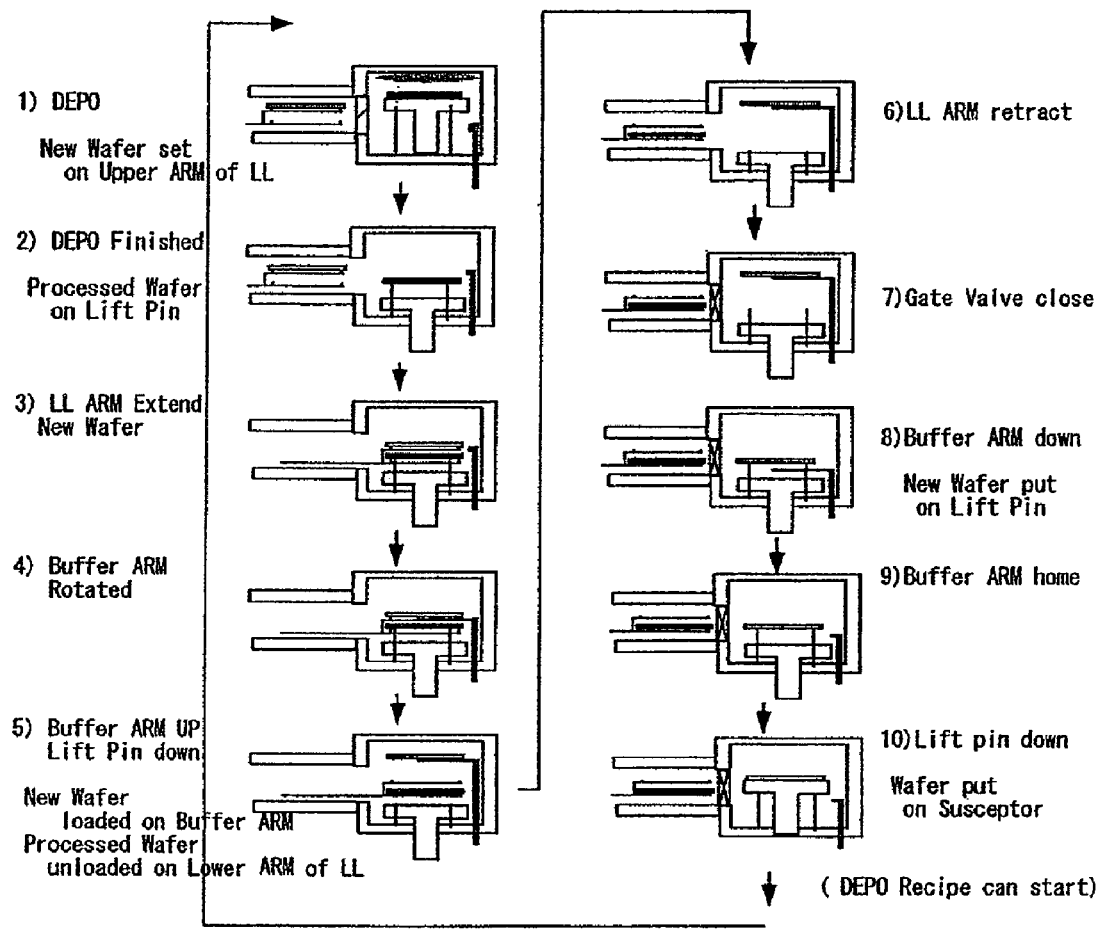
FIG. 8 shows schematic diagrams of reactor operations in an embodiment of the present invention.

An operation sequence utilizing the buffer mechanism according to an embodiment of the present invention is described in detail below. FIG. 7 shows an operation sequence when buffering a unprocessed wafer and a processed wafer in an embodiment. FIG. 8 shows schematic diagrams of reactor operations in an embodiment (e.g., the Dragon™ reaction chamber with a wafer buffer mechanism, manufactured by ASM Japan). First, an unprocessed substrate is loaded on an upper end-effector of a transferring arm in the load-lock chamber (Process 1). A susceptor on which a processed substrate is placed in the reaction chamber is lowered, thereby supporting the processed substrate on lift pins extending upward from the susceptor (for the first time, no processed substrate is in the reaction chamber) (Process 2). Upon opening the gate valve, the transferring arm is laterally extended from the load-lock chamber to the reaction chamber, whereby the processed substrate supported on the lift pins is located between the upper end-effector and a lower end-effector of the transferring arm, where the unprocessed substrate is on the upper end-effector (Process 3). Buffer arms at an unloading/loading position rotate in a lateral direction toward the unprocessed substrate, and the unprocessed substrate is supported using the buffer arms provided in the reaction chamber, thereby loading the unprocessed substrate on the buffer arms (Process 4). The buffer arms are raised to a buffer position with the unprocessed substrate while lowering the lift pins, thereby placing the processed substrate on the lower end-effector (Process 5). The transferring arm is retraced from the reaction chamber to the load-lock chamber (Process 6). The gate valve is then closed (Process 7). The buffer arms are lowered to a bottom position with the unprocessed substrate, thereby supporting the unprocessed substrate on the lift pins extending upward from the susceptor (Process 8). The buffer arms rotate in the lateral direction away from the unprocessed substrate to its home position (Process 9). The susceptor is then raised and the lift pins are retracted, thereby loading the unprocessed substrate on the susceptor (Process 10). After Process 10, a processing recipe such as a deposition recipe can begin. The processed substrate in the load-lock chamber is unloaded from the lower end-effector and Process 1 is performed in the load-lock chamber while processing the unprocessed substrate in the reaction chamber, followed by Processes 2 to 10.

As shown in FIG. 7, in this embodiment, the time period for replacing an unprocessed substrate with a processed substrate on the end-effectors as viewed in the load-lock chamber was 7.7 seconds (from the beginning of Process 1 to the end of Process 7). This is a significant improvement on throughput. In U.S. Pat. No. 6,860,711, although the buffer mechanisms is used, the time period for replacing an unprocessed substrate with a processed substrate on the end-effectors as viewed in the load-lock chamber was about 20 seconds. The sequence used in the embodiment is highly effective.

The buffer mechanism can be any suitable buffer mechanism capable of moving vertically and laterally and buffering a substrate. In an embodiment, the buffer mechanism buffers a substrate on the upper end-effector, whereas the lift pins buffer a substrate on the lower end-effector.

The method of transferring substrates can be applied to any suitable application other than semiconductor manufacturing. Substrates can be transferred between a first chamber and a second chamber. The substrate can be any type of substrate. In an embodiment, a first substrate is loaded on an upper end-effector of a transferring arm in the first chamber (Process (i)). The transferring arm is laterally extended from the first chamber to the second chamber, whereby a second substrate in the second chamber is located between the upper end-effector and a lower end-effector of the transferring arm, where the first substrate is on the upper end-effector (Process (ii)). The first substrate is unloaded from the upper end-effector and loading the second substrate on the lower end-effector (Process (iii)). The transferring arm is retracted from the second chamber to the first chamber (Process (iv)). The second substrate is unloaded from the lower end-effector and Process (i) is performed in the first chamber (Process (v)), followed by Processes (ii) to (v).

At least one embodiment of the present invention can exhibit at least the following effects. These effects are not intended to limit all embodiments.

By a combination of the dual end-effectors and the buffer mechanism, by keeping processed or unprocessed wafers standing by inside the reactor, a processed wafer and an unprocessed wafer can be switched very efficiently. In doing so, despite the configuration having one transferring arm per reactor, an apparatus with ability greater than that with double arms is able to be achieved. Consequently, the problem caused by the transfer rate-limiting factors is solved and a semiconductor-processing apparatus realizing stable processes and extremely high throughput can be realized.

Additionally, because the capacity of a load-lock chamber can be reduced as compared with a conventional apparatus with double arms, a semiconductor-processing apparatus realizing low costs, a small footprint and a small faceprint can be provided.

In the present disclosure where conditions and/or structures are not specified, the skilled artisan in the art can readily provide such conditions and/or structures, in view of the present disclosure, as a matter of routine experimentation.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A substrate transfer apparatus for loading and unloading substrates in a reaction chamber, comprising:
    an arm having a distal end which is laterally movable in a straight line direction; and
    end-effectors for loading and unloading substrates in a reaction chamber, which include a lower end-effector and an upper end-effector,
    wherein one of the lower end-effector or the upper end-effector is movably coupled to the arm at the distal end of the arm, and the other of the lower end-effector or the upper end-effector is fixed to the movably coupled end-effector,
    wherein the movably coupled end-effector has a front side, rear side, right side, and left side, and the fixed end-effector is comprised of multiple portions which are fixed to the movably coupled end-effector exclusively at the right and left sides.

2. The substrate transfer apparatus according to claim 1, wherein the movably coupled end-effector is the lower end-effector, and the fixed end-effector is the upper end-effector.

3. The substrate transfer apparatus according to claim 2, wherein the upper end-effector is comprised of two elongated portions which are disposed parallel to each other and fixed to the right and left sides of the lower end-effectors, respectively.

4. The substrate transfer apparatus according to claim 3, wherein each elongated portion of the upper end-effector has two substrate-contacting portions, and the lower end-effector has four substrate-contacting portions.

5. The substrate transfer apparatus according to claim 1, wherein the front and rear sides of the movably coupled end-effector face a direction of lateral movement of the movably coupled end-effector.

6. The substrate transfer apparatus according to claim 1, wherein the arm is configured to laterally and linearly move the end-effectors in a direction.

7. The substrate transfer apparatus according to claim 6, wherein the arm comprises a proximal link and a distal link movably coupled to each other with a joint, and the end-effectors are movably coupled to the distal link with a joint.

8. The substrate transfer apparatus according to claim 1, further comprising a load-lock chamber wherein the arm and the end-effectors are disposed when the arm and the end-effectors are at a retracted position.

9. A substrate processing apparatus comprising:
    a load-lock chamber;
    at least one reaction chamber connected to the load-lock chamber via a gate valve; and
    the substrate transfer apparatus of claim 1 disposed in the load-lock chamber,
    wherein the arm and the end-effectors are extendable to the reaction chamber through the gate valve when opened for loading and unloading substrates in the reaction chamber.

10. The substrate processing apparatus according to claim 9, further comprising an atmospheric robot arm which is accessible to the load-lock chamber via a gate valve when opened for loading and unloading substrates in the load-lock chamber.

11. The substrate processing apparatus according to claim 9, wherein the reaction chamber is provided with a buffer mechanism for keeping a substrate standing by inside the reaction chamber.

12. A substrate transfer apparatus for loading and unloading substrates in a reaction chamber, comprising:
    an arm having a distal end which is movable for transferring substrates to or from a reaction chamber; and
    end-effectors for loading and unloading substrates in the reaction chamber, which include a lower end-effector and an upper end-effector,
    wherein one of the lower end-effector or the upper end-effector is coupled to the arm at the distal end of the arm, and the other of the lower end-effector or the upper end-effector is fixed to the arm-coupled end-effector,
    wherein the arm-coupled end-effector has a front side, rear side, right side, and left side, and the fixed end-effector is comprised of multiple portions which are fixed only to the arm-coupled end-effector at the right and left sides.

13. The substrate transfer apparatus according to claim 12, wherein the distal end of the arm is laterally movable in a straight line direction.

14. The substrate transfer apparatus according to claim 13, wherein the front and rear sides of the arm-coupled end-effector face a direction of lateral movement of the arm-coupled end-effector.

15. The substrate transfer apparatus according to claim 12, wherein the arm-coupled end-effector is the lower end-effector, and the fixed end-effector is the upper end-effector, wherein the upper end-effector is comprised of two elongated portions which are disposed parallel to each other and fixed only to the right and left sides of the lower end-effectors, respectively.

* * * * *

UNITED STATES PATENT AND TRADEMARK OFFICE
CERTIFICATE OF CORRECTION

PATENT NO. : 7,690,881 B2 Page 1 of 1
APPLICATION NO. : 11/512637
DATED : April 6, 2010
INVENTOR(S) : Yamagishi et al.

It is certified that error appears in the above-identified patent and that said Letters Patent is hereby corrected as shown below:

At column 3, line 53, please remove "2422:" and insert therefore, --22:--.

Signed and Sealed this

Thirtieth Day of November, 2010

David J. Kappos
*Director of the United States Patent and Trademark Office*